United States Patent
Hacke (10) Patent No.: US 6,506,631 B2
(45) Date of Patent: Jan. 14, 2003

(54) METHOD FOR MANUFACTURING INTEGRATED CIRCUITS AND SEMICONDUCTOR WAFER WHICH HAS INTEGRATED CIRCUITS

(75) Inventor: Hans-Jürgen Hacke, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/790,025

(22) Filed: Feb. 21, 2001

(65) Prior Publication Data

US 2001/0019855 A1 Sep. 6, 2001

Related U.S. Application Data

(63) Continuation of application No. PCT/DE99/02412, filed on Aug. 2, 1999.

(30) Foreign Application Priority Data

Aug. 21, 1998 (DE) .......................................... 198 38 153

(51) Int. Cl.[7] .......................... H01L 21/44; H01L 21/48; H01L 21/50; H01L 21/4763
(52) U.S. Cl. ...................... 438/125; 438/113; 438/118; 438/618; 438/669
(58) Field of Search ................................ 438/113, 118, 438/125, 618, 669

(56) References Cited

U.S. PATENT DOCUMENTS

| | | | | |
|---|---|---|---|---|
| 5,905,303 A | * | 5/1999 | Kata et al. | 257/701 |
| 5,946,555 A | * | 8/1999 | Crumly et al. | 438/125 |
| 6,087,717 A | * | 7/2000 | Ano et al. | 257/684 |
| 6,171,946 B1 | * | 1/2001 | Tsukamoto | 438/623 |

FOREIGN PATENT DOCUMENTS

| | | |
|---|---|---|
| EP | 0 704 895 A2 | 4/1996 |
| EP | 0 704 899 A2 | 4/1996 |
| EP | 0 734 059 A2 | 4/1996 |
| EP | 0 786 808 A1 | 7/1997 |

* cited by examiner

*Primary Examiner*—Tuan H. Nguyen
*Assistant Examiner*—Nema Berezny
(74) *Attorney, Agent, or Firm*—Laurence A. Greenberg; Werner H. Stemer; Gregory L. Mayback (57) ABSTRACT

A method for manufacturing integrated circuits is described. A semiconductor wafer having an active side with circuit structures is provided. An electrically insulating intermediate layer and an electrically conductive conductor foil are applied to the active side. Conductor tracks with terminal balls are formed with a relatively large spacing pattern in the conductor foil. The semiconductor wafer is subsequently divided up into integrated circuits.

15 Claims, 6 Drawing Sheets

METHOD FOR MANUFACTURING INTEGRATED CIRCUITS AND SEMICONDUCTOR WAFER WHICH HAS INTEGRATED CIRCUITS

CROSS-REFERENCE TO RELATED APPLICATION

This application is a continuation of copending International Application No. PCT/DE99/02412, filed Aug. 2, 1999, which designated the United States.

BACKGROUND OF THE INVENTION

Field of the Invention

The invention relates to a method for manufacturing integrated circuits and a semiconductor wafer that can be used in the method according to the invention.

In the prior art, fabrication methods for manufacturing integrated circuits, in particular chip-size packages from semiconductor wafers are known in which, in a first step, circuit structures for a plurality of integrated circuits are manufactured on an active side of a semiconductor wafer. Then, the integrated circuits are divided up into so-called chips by sawing the semiconductor wafer into individual pieces at the edge areas of the integrated circuits. Contact is made with the chips in each case at so-called interposers that may be of a rigid or a flexible configuration. It is also conceivable to make contact with a chip on a so-called lead frame. The contact can be made with different contacting methods, for example with a wire contacting method, with a flip-chip contacting method or with a TAB contacting method.

SUMMARY OF THE INVENTION

It is accordingly an object of the invention to provide a method for manufacturing integrated circuits and a semiconductor wafer which has integrated circuits which overcomes the above-mentioned disadvantages of the prior art methods of this general type, in which a simplified method for manufacturing integrated circuits is described.

With the foregoing and other objects in view there is provided, in accordance with the invention, a manufacturing method for forming integrated circuits. The method includes the steps of:

providing a semiconductor wafer having an active side with circuit structures for forming at least two integrated circuits;

providing at least one electrically insulating intermediate layer;

applying at least one electrically conductive conductor foil to the electrically insulating intermediate layer;

forming at least one through-opening in the electrically insulating intermediate layer, the at least one through-opening extends from an underside of the electrically conductive conductor foil to an underside of the electrically insulating intermediate layer;

applying the least one electrically insulating intermediate layer having the electrically conductive conductor foil to the active side of the semiconductor wafer;

forming conductor tracks from the electrically conductive conductor foil; and dividing the semiconductor wafer into individual integrated circuits.

The method according to the invention ensures a simple way to manufacture integrated circuits. A relatively thick organic dielectric layer is first provided for compensating for expansion. The final conductor structure with large conductor cross sections is produced only at the wafer level of the semiconductor wafer. The basic principle is to laminate a copper foil onto the semiconductor wafer, form a contact between the copper foil and the chip terminals or the connecting contacts of the integrated circuits and only then implement rewiring using photolithographic and etching technology.

The resin cover for a solder stop masking of the terminals can then be provided. Finally, the application of solder balls and the cutting up of the semiconductor wafer into individual packages can be carried out, for example by sawing. Generally, in order to give the semiconductor chip a particularly level surface it is possible to accompany the application of the copper foil laminate with a suitable corresponding coating on the passive reverse side of the chip.

In a development of the invention, the step of applying the intermediate layer to at least one electrically conductive conductor foil is carried out before the step of applying the intermediate layer to the active side of the semiconductor wafer. This embodiment of the method according to the invention serves as a basis for variants in which the intermediate layer is completely manufactured together with the conductor foil before application to the semiconductor wafer. In these embodiments of the method according to the invention it is particularly advantageous that manufacturing steps which are carried out on the intermediate layer and on the conductor foil do not affect the integrated circuits on the semiconductor wafer.

Before the step of applying the intermediate layer to the active side of the semiconductor wafer it is possible to provide the step of making at least one through-opening in the intermediate layer, the through-opening being embodied in such a way that it extends from an underside of the conductor foil to the underside of the intermediate layer. Then, contact can be made with the conductor foil through the through-opening. The through-opening is preferably made with a laser method, which enables precise through-openings to be achieved.

In order to make contact with the conductor foil through the intermediate layer it is possible to introduce a conductive filler and connecting material such as a solder material into the through-opening, specifically in particular by an electrodeposition method. This ensures that the semiconductor wafer according to the invention is manufactured in a particularly cost-effective and reliable way.

The step of heating the solder material in the through-opening may be provided in order to make contact between the conductor foil and the contact points on the integrated circuits on the semiconductor wafer, and may specifically be provided after the application of the intermediate layer to the active side of the semiconductor wafer. When the solder material in the through-opening is heated, the solder material is melted and forms a conductive connection with the contact points provided on the semiconductor wafer. Such heating is preferably carried out at points on the conductor foil in the vicinity of the through-opening so that the effect of the heat on the semiconductor wafer according to the invention is particularly low.

In a modification of the embodiments of the method according to the invention given above it is also possible to introduce a conductive adhesive as the conductive filler and connecting material into the through-opening, specifically in particular by a doctor blade method. The provision of the conductive adhesive in the through-openings favors largescale series fabrication of the semiconductor wafer according to the invention. Here, the step of curing the conductive adhesive in the through-openings may be provided after the step of applying the intermediate layer to the active side of the semiconductor wafer, and may specifically be provided in such a way that the conductive adhesive forms a conductive connection both with the conductor foil and with contact points provided on the semiconductor wafer. A particularly favorable connection between the semiconductor wafer, the intermediate layer and the conductor foil is obtained if the step of applying the intermediate layer to the active side of the semiconductor wafer is carried out with a lamination method, in particular with the application of pressure and heat.

With the foregoing and other objects in view there is further provided, in accordance with the invention, a second method for manufacturing integrated circuits. The method includes the steps of:

providing a semiconductor wafer having an active side with circuit structures for at least two integrated circuits;

applying at least one electrically insulating intermediate layer to the active side of the semiconductor wafer;

applying a solder material to contact points provided on the semiconductor wafer by an electro-deposition method or an electroless deposition;

applying at least one electrically conductive conductor foil to the electrically insulating intermediate layer, an application of the electrically conductive conductor foil to the electrically insulating intermediate layer being provided after an application of the electrically insulating intermediate layer to the active side of the semiconductor wafer;

forming conductor tracks from the electrically conductive conductor foil; and dividing the semiconductor wafer into individual integrated circuits.

A fundamentally different group of manufacturing methods for semiconductor wafers according to the invention provides that the step of applying the conductor foil to the intermediate layer is not carried out before but rather after the step of applying the intermediate layer to the active side of the semiconductor wafer. In these embodiments of the method according to the invention it is particularly advantageous that the handling of the conductor foil together with the intermediate layer is simplified because together they form one thin layer and are moved together.

In this context there is in particular provision that the intermediate layer is manufactured on the active side of the semiconductor wafer using a printing method. To do this, it is possible, for example, to apply adhesive to the active side of the semiconductor wafer.

If a solder material has been applied to the contact points provided on the semiconductor wafer, it is melted by heating after the application of the conductor foil to the intermediate layer, with the result that a conductive connection is produced between areas of the conductor foil and the contact points provided on the semiconductor wafer.

The methods explained above give rise to the semiconductor wafer according to the invention on which the insulating intermediate layer is formed, and the conductive conductor foil is formed on top of it. Subsequently, the conductor tracks are formed in the conductor foil, specifically in particular with an etching method by etching away areas of the conductor foil. To do this, conventional techniques may be used, it being possible in particular to provide the step of coating the conductor foil with etching resist and forming the conductor tracks using photolithographic steps.

Finally, the step of performing solder stop masking of ball land areas and the step of producing solder balls at predefined points on the conductor foil is carried out, which simplifies the later formation of contacts with the integrated circuits provided on the semiconductor wafer according to the invention.

The semiconductor wafer according to the invention is characterized by an active side with circuit structures, at least one electrically insulating intermediate layer and at least one electrically conductive conductor foil with conductor tracks being provided on the active side. A conductive filler and connecting material are provided here between the contact points on the semiconductor wafer and areas of the conductor foil.

The finished semiconductor wafer according to the invention is sawn into individual integrated circuits. This is carried out with high-speed cutting disks that are equipped with diamond particles. The diamond particles are very thin and are clamped into a mandrel in such a way that they protrude by a small amount. To do this, a plate is moved over the semiconductor wafer with numerical control and precise clocking in the grid spacing of the integrated circuits so that the integrated circuits are separated. The semiconductor wafer is previously bonded onto a foil so that the integrated circuits remain in their order during the sawing process. This foil is also sawn as the semiconductor wafer is sawn.

Other features which are considered as characteristic for the invention are set forth in the appended claims.

Although the invention is illustrated and described herein as embodied in a method for manufacturing integrated circuits and a semiconductor wafer which has integrated circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 1 thereof, there is shown in cross section layers of a first semiconductor wafer 1 according to the invention.

Figure 1:
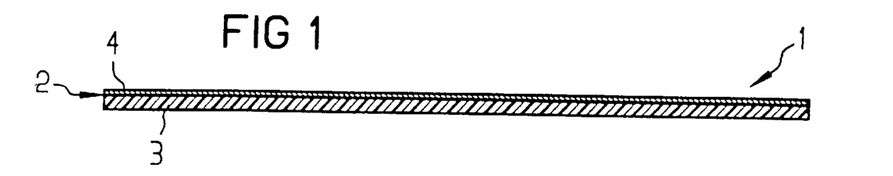
FIGS. 1–7 are diagrammatic, sectional views of manufacturing steps for producing a first semiconductor wafer according to the invention.

FIG. 1 shows a printed circuit board 2, which is divided into an electrically insulating intermediate layer 3 and into an electrically conductive copper coating 4 which is applied over a surface of the electrical intermediate layer 3.

FIG. 1 shows the printed circuit board 2 in its basic state, that is to say a B stage material coated with copper or a carrier material coated with an adhesive.

Figure 2:
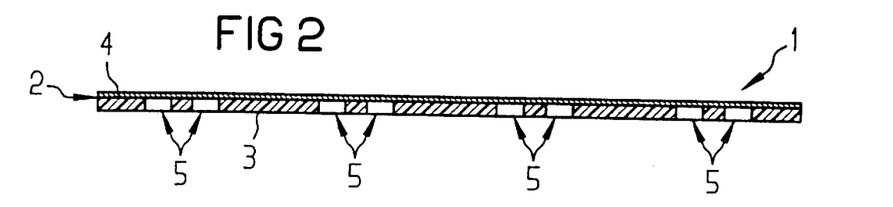

FIG. 2 illustrates the first manufacturing step of the semiconductor wafer 1 according to the invention. In this step, through-openings 5 are made in the intermediate layer 3 of the printed circuit board 2 and extend from the copper coating 4 to an underside of the intermediate layer 3. A laser method is preferably used for this.

Figure 3:
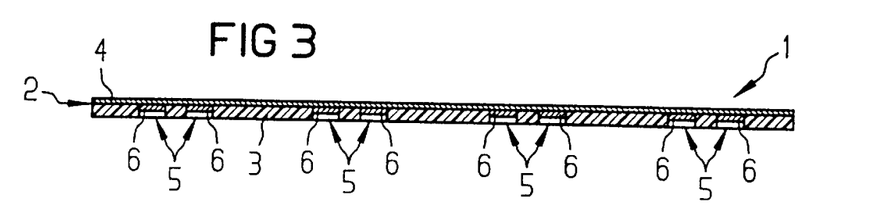

FIG. 3 illustrates a further manufacturing step for manufacturing the semiconductor wafer 1. In this step, a older material 6 in the form of tin is electro-deposited in the through-openings 5, the solder material 6 being present on the underside of the copper coating 4.

Figure 4:
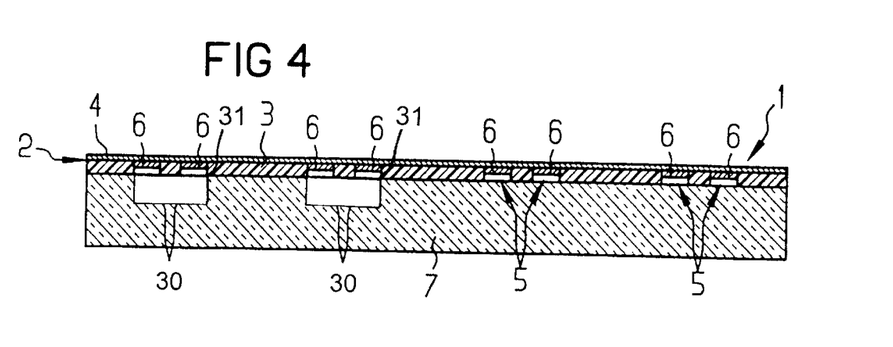

FIG. 4 illustrates a further manufacturing step for manufacturing the semiconductor wafer 1. Here, the printed circuit board 2 in FIG. 3 is applied to a semiconductor wafer 7 that has integrated circuits 30 on its upper side. The connection of the printed circuit board 2 to the semiconductor wafer 7 is manufactured by a lamination process. The printed circuit board 2 is laminated here onto the semiconductor wafer 7 in such a way that the through-openings 5 come to rest precisely over Ni/Au bumps 31 being contact points 31 on the integrated circuits 30 on the semiconductor wafer 7.

Figure 5:
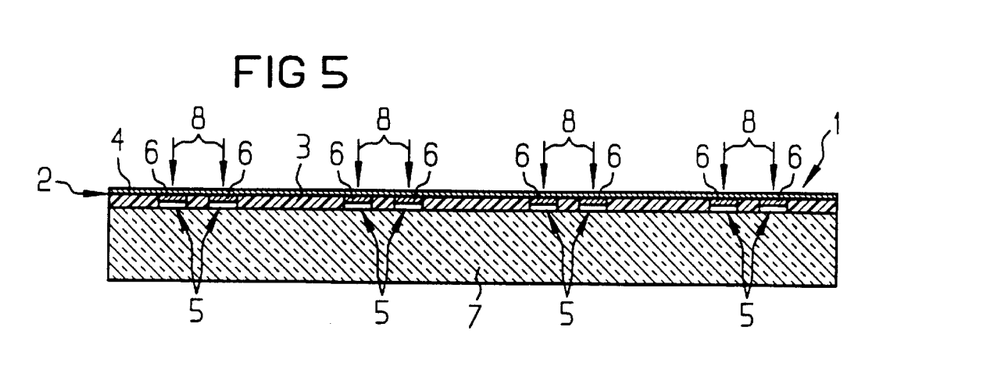

FIG. 5 illustrates a further manufacturing step during the manufacture of the semiconductor wafer 1 according to the invention. By heating points on an upper side of the printed circuit board 2 in areas around the through-openings 5, the solder material 6 is melted using a laser beam 8 so that it forms an intimate connection with the wettable terminals (not illustrated in this view), for example the Ni/Au bumps and with corresponding areas on the copper coating 4, and forms an electrically conductive connection between the copper coating 4 and contact areas on the integrated circuits 30 on the semiconductor wafer 7.

Figure 6:
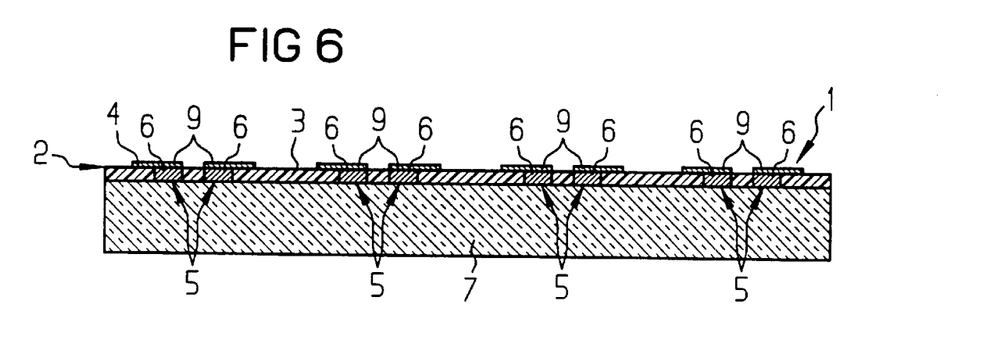

FIG. 6 shows a further step during the manufacture of the semiconductor wafer 1 according to the invention. In this step, conductor tracks 9, which permit contact to be made as desired with the through-openings 5, are formed in the copper coating 4 using a photolithographic technique and an etching technique.

Figure 7:
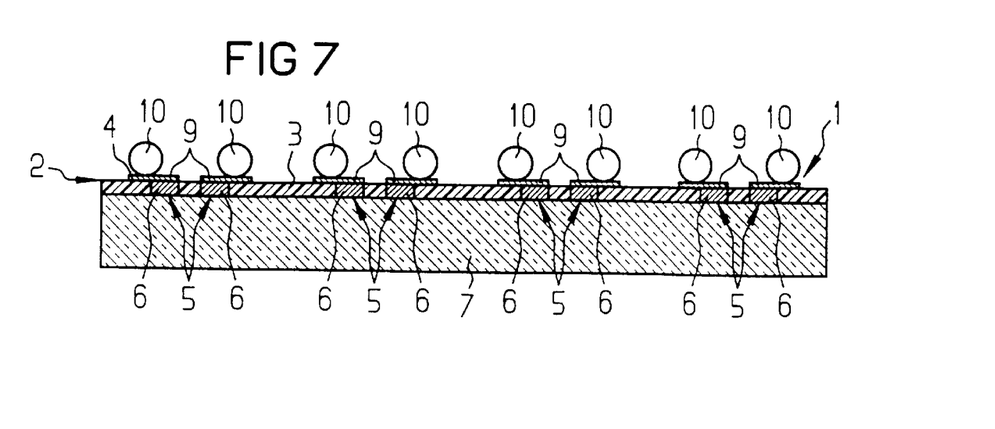
Figure 8:
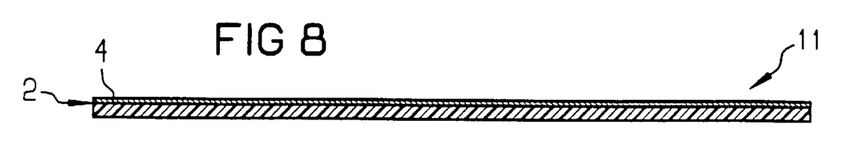
FIGS. 8–13 are sectional views of the manufacturing steps for producing a second semiconductor wafer.
Figure 9:
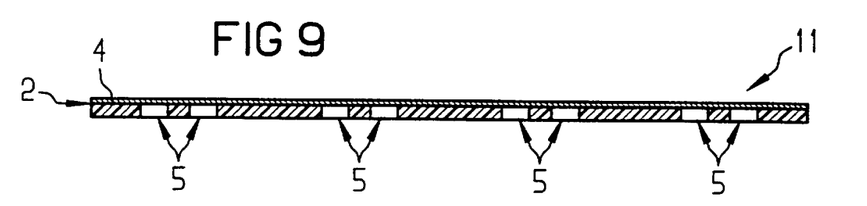

FIG. 7 illustrates a further manufacturing step of the semiconductor wafer 1 according to the invention. In this step, the conductor tracks 9 are provided with solder stop masking (not shown in this view), on which so-called balls 10 are formed on the conductor tracks 9. In a manufacturing step (not illustrated here in more detail), the semiconductor wafer 1 is subsequently sawn into so-called individual chips.

FIGS. 8–13 illustrate the manufacture of a second semiconductor wafer 11 according to the invention. The manufacture of the second semiconductor wafer 11 corresponds essentially to the manufacture of the first semiconductor wafer 1. For this reason, identical parts are provided with the same reference numbers.

Figure 10:
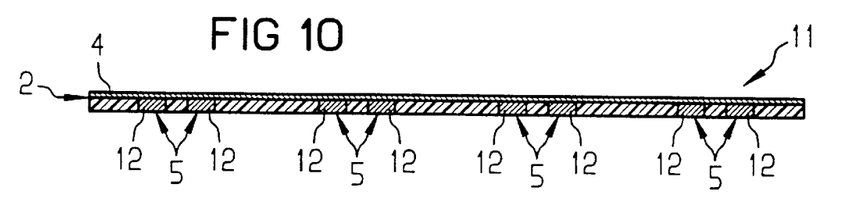
Figure 11:
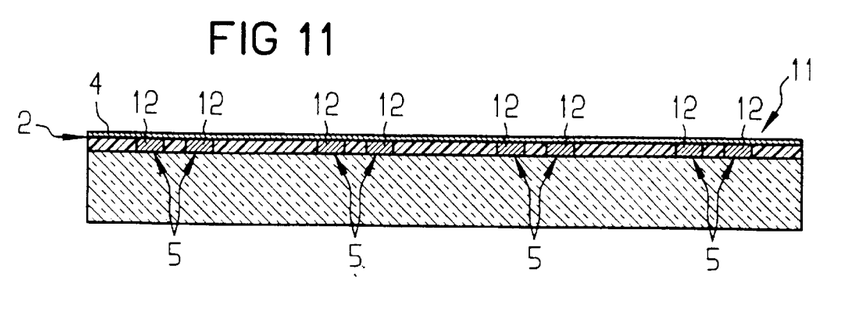
Figure 12:
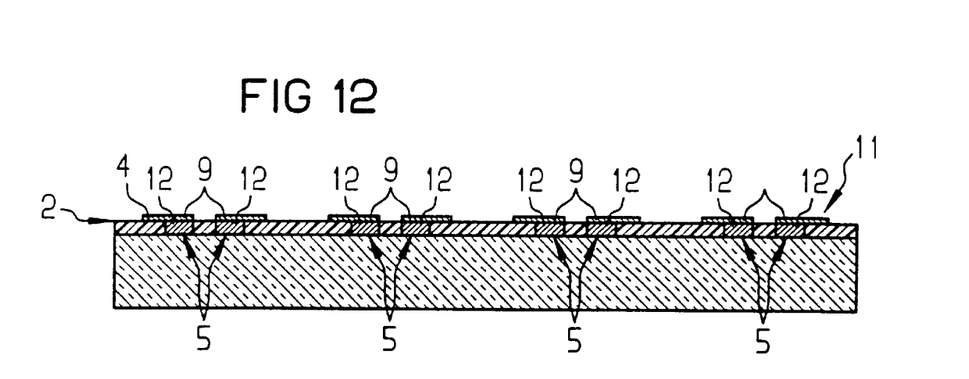
Figure 13:
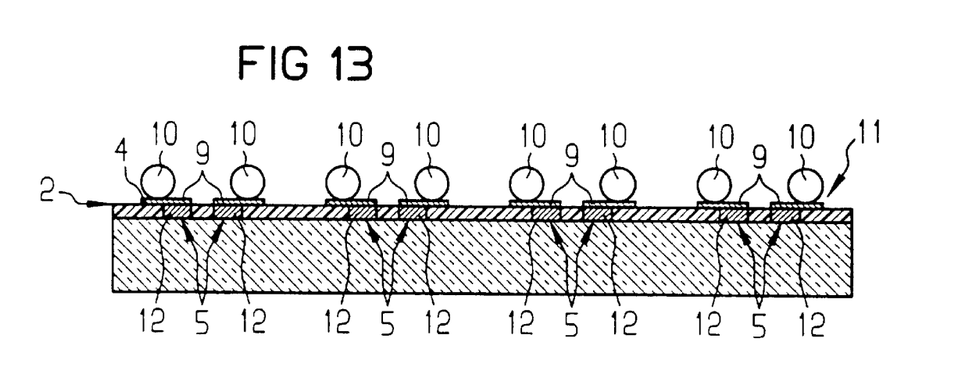

In contrast to the first semiconductor wafer 1 in FIGS. 1–7, in the second semiconductor wafer 11 in the manufacturing step according to FIG. 10, a conductive adhesive 12 is introduced into the through-openings 5 by a doctor blade method. During the lamination of the printed circuit board 2 onto the semiconductor wafer 7, the conductive adhesive 12 introduced into the through-openings 5 is simultaneously cured.

All the other manufacturing steps for manufacturing the semiconductor wafer 11 correspond essentially to the manufacturing steps for the semiconductor wafer 1.

FIGS. 14–18 illustrate the manufacture of a third semiconductor wafer 20 according to the invention.

Figure 14:
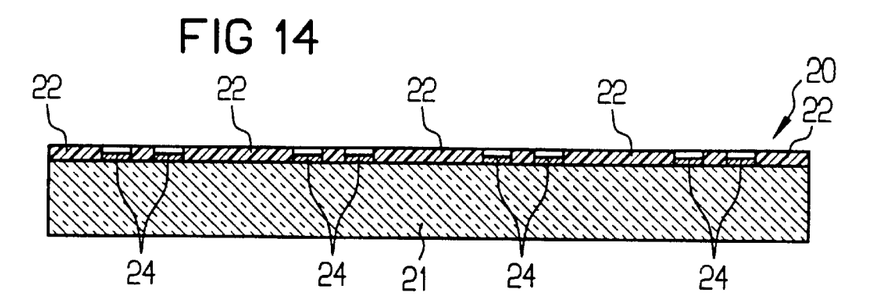
FIGS. 14–18 are sectional views of the manufacturing steps for producing a third semiconductor wafer.

In a first manufacturing step, which can be followed best in FIG. 14, an electrically insulating intermediate layer 22 is printed, using a screen print template method, onto a semiconductor wafer 21, on which the integrated circuits (not visible in this view) are formed. Contact areas are provided with layers of Ni/Au (not visible in this view), on which a solder material 24 is applied.

Figure 15:
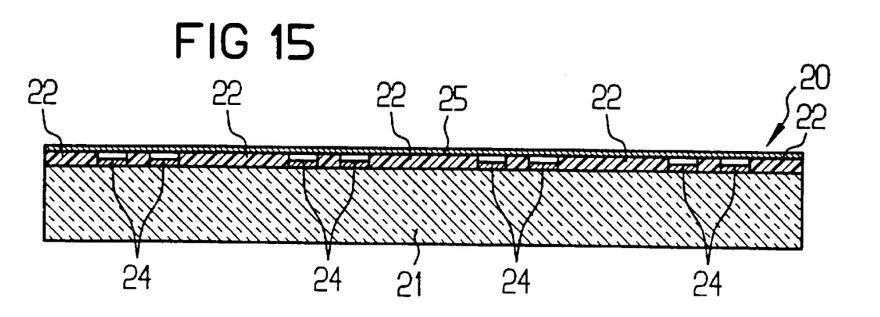

In the manufacturing step illustrated in FIG. 15, a copper coating 25 is applied to an upper surface of the intermediate layer 22 and to the surface of the solder material 24.

Virtual through-openings that are filled with the solder material 24 are made in junction areas to the intermediate layer 22 by the solder material 24.

Figure 16:
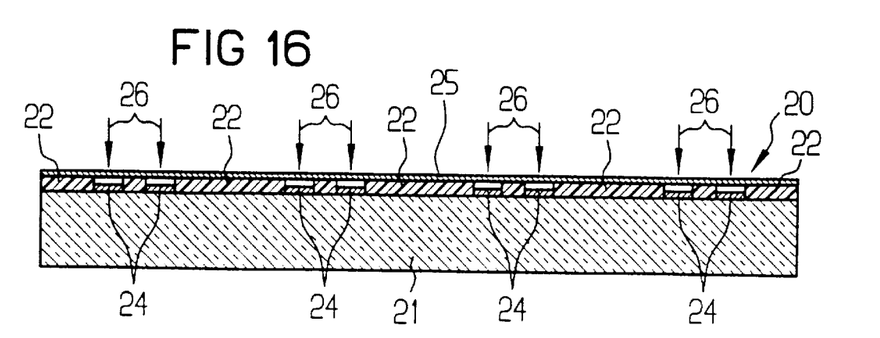

In the manufacturing step illustrated in FIG. 16, the solder material 24 is melted by heating points using laser beams 26 so that a conductive connection is produced between the copper coating 25 and the contact areas (not visible in this view) of the integrated circuits provided on the semiconductor wafer 21.

Figure 17:
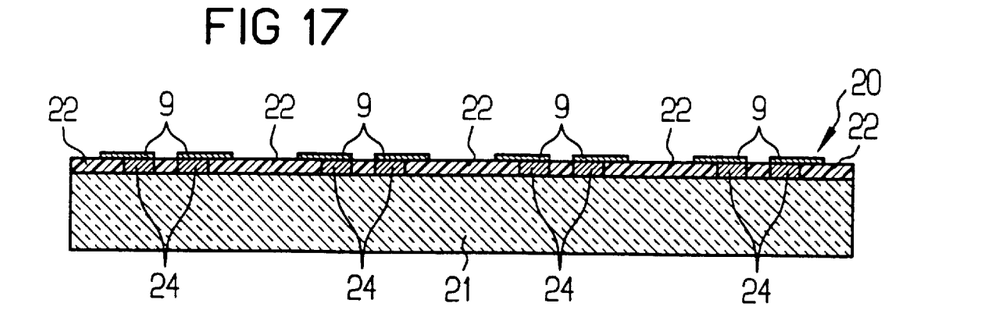
Figure 18:
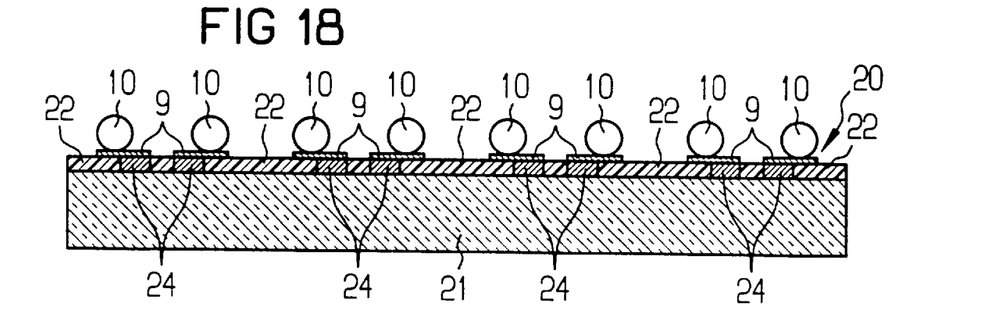

In the manufacturing steps illustrated in FIGS. 17 and 18, the conductor tracks 9 and the balls 10 are formed on the third semiconductor wafer 20, the third semiconductor wafer 20 corresponding to the first semiconductor wafer 1 according to the invention and to the second semiconductor wafer 20 according to the invention in FIGS. 1–13. For this reason, identical parts are provided with the same reference numbers.

I claim:

1. A manufacturing method, which comprises the steps of:
    providing a semiconductor wafer having an active side with circuit structures for forming at least two integrated circuits;
    providing at least one electrically insulating intermediate layer;
    applying at least one electrically conductive conductor foil to the electrically insulating intermediate layer;
    forming at least one through-opening in the electrically insulating intermediate layer, the at least one through-opening extends from an underside of the electrically conductive conductor foil to an underside of the electrically insulating intermediate layer;
    applying the at least one electrically insulating intermediate layer to the active side of the semiconductor wafer with the electrically conductive conductor foil disposed opposite from the active side of the semiconductor wafer;
    subsequently forming conductor tracks from the electrically conductive conductor foil; and
    dividing the semiconductor wafer into individual integrated circuits.

2. The method according to claim 1, which comprises introducing a conductive filler and connecting material into the at least one through-opening before carrying out the step of applying the at least one electrically insulating intermediate layer having the electrically intermediate layer having the electrically conductive conductor toil to the active side of the semiconductor wafer.

3. The method according to claim 2, which comprises:
    using a solder material as the conductive filler and connecting material; and
    using an electrodepostion process for introducing the solder material into the at least one through-opening.

4. The method according to claim 3, which comprises heating the solder material in the at least one through-opening after the step of applying the electrically insulating intermediate layer to the active side of the semiconductor wafer, such that the solder material is melted by the heating and forms a conductive connection with contact points provided on the semiconductor wafer.

5. The method according to claim 2, which comprises using a conductive adhesive as the conductive filler and connecting material and using a doctor blade for introducing the conductive adhesive into the at least one through-opening.

6. The method according to claim 5, which comprises curing the conductive adhesive in the at least one through-opening after performing the step of applying the electrically insulating intermediate layer to the active side of the semiconductor wafer such that the conductive adhesive forms a conductive connection with contact points provided on the semiconductor wafer.

7. The method according to claim 1, which comprises performing the step of applying the electrically insulating intermediate layer to the active side of the semiconductor wafer by a lamination method which includes an application of pressure and heat.

8. The method according to claim 1, which comprises using a laser for forming the at least one through-opening.

9. A manufacturing method, which comprises the steps of:
    providing a semiconductor wafer having an active side with circuit structures for at least two integrated circuits;
    applying at least one electrically insulating intermediate layer to the active side of the semiconductor wafer;
    applying a solder material to contact points provided on the semiconductor wafer using a method selected from the group consisting of electro-deposition methods and electroless deposition methods;
    subsequently applying at least one electrically conductive conductor foil to the electrically insulating intermediate layer, an application of the electrically conductive conductor foil to the electrically insulating intermediate layer being provided after an application of the electrically insulating intermediate layer to the active side of the semiconductor wafer;
    subsequently forming conductor tracks from the electrically conductive conductor foil; and
    dividing the semiconductor wafer into individual integrated circuits.

10. The method according to claim 9, which comprises manufacturing the electrically insulating intermediate layer from an adhesive applied to the active side of the semiconductor wafer using a printing method.

11. The method according to claim 9, which comprises heating the solder material on the contact points provided on the semiconductor wafer such that the solder material is melted by the heating and forms at least one of a conductive connection with the contact points provided on the semiconductor wafer and with areas of the electrically conductive conductor foil.

12. The method according to claim 9, which comprises performing the forming of the conductor tracks in the electrically conductive conductor foil by an etching method which etches away areas of the electrically conductive conductor foil.

13. The method according to claim 12, which comprises coating the electrically conductive conductor foil with an etching resist coating before performing the step of etching away the areas of the electrically conductive conductor foil.

14. The method according to claim 12, which comprises forming photolithographically the conductor tracks on the electrically conductive conductor foil before performing the step of etching away the areas of the electrically conductive conductor foil.

15. The method according to claim 9, which comprises:
    marking solder stop ball land areas; and
    producing solder balls at predefined points on the electrically conductive conductor foil.

* * * * *